US011848651B2

(12) United States Patent
Midya et al.

(10) Patent No.: US 11,848,651 B2
(45) Date of Patent: Dec. 19, 2023

(54) SWITCHING AMPLIFIER SYSTEM WITH FEEDBACK

(71) Applicant: ADX Research, Inc., Schaumburg, IL (US)

(72) Inventors: Pallab Midya, Schaumburg, IL (US); Adip Kumar Dutta, Kolkata (IN); Uma Ekambaram Iyer, Bangalore (IN)

(73) Assignee: ADX Research, Inc., Schaumburg, IL (US)

( * ) Notice: Subject to any disclaimer, the term of this patent is extended or adjusted under 35 U.S.C. 154(b) by 219 days.

(21) Appl. No.: 17/463,593

(22) Filed: Sep. 1, 2021

(65) Prior Publication Data

US 2023/0069006 A1 Mar. 2, 2023

(51) Int. Cl.
*H03F 3/217* (2006.01)
*H03F 3/38* (2006.01)
*H03K 7/08* (2006.01)

(52) U.S. Cl.
CPC ............ *H03F 3/2171* (2013.01); *H03K 7/08* (2013.01); *H03F 2200/351* (2013.01)

(58) Field of Classification Search
CPC ............ H03F 3/2171; H03F 2200/351; H03F 1/3211; H03F 2200/03; H03F 3/183; H03K 7/08
USPC ........................................ 330/10, 251, 207 A
See application file for complete search history.

(56) References Cited

U.S. PATENT DOCUMENTS

| 7,378,904 | B2 * | 5/2008 | Risbo | H03F 3/217 330/10 |
| 11,290,070 | B2 * | 3/2022 | Zanbaghi | H03F 3/187 |
| 2007/0229159 | A1 * | 10/2007 | Krishnan | H03F 3/217 330/253 |

OTHER PUBLICATIONS

Large-Signal Design and Performance of a Digital PWM Amplifier; Pallab Midya and Bill Roeckner; ADX Research, Inc., Schaumburg, IL, 60173, USA.
Pedec—A Novel Pulse Referenced Control Method for High Quality Digital PWM Switching Amplification; Karsten Nielsen; Bang & Olufsen N S , Struer, Denmark; Dept. of Applied Electronics, DTU, Denmark.

* cited by examiner

*Primary Examiner* — Hieu P Nguyen
(74) *Attorney, Agent, or Firm* — Jason C. Cameron

(57) ABSTRACT

A switching amplifier system with a power supply, a pulse modulator configured to modulate an input signal into a pulse width modulation signal, a switching stage configured to generate an amplified output signal, and an error feedback signal configured to correct errors in the amplified output signal, where the input signal is comprised of at least one of an analog signal and a digital signal. A method of signal amplification comprising generating, by a pulse width modulator, a pulse width modulation signal, combining, by a switching stage, the input signal and the pulse width modulation signal to form an amplified output signal, and generating, by the switching stage, an error feedback signal, where the error feedback signal is configured to correct errors in the amplified output signal, and where the input signal is comprised of at least one of an analog signal and a digital signal.

18 Claims, 13 Drawing Sheets

SWITCHING AMPLIFIER SYSTEM WITH FEEDBACK

BACKGROUND

Embodiments of the present disclosure relate to a switching amplifier, and more specifically, for a class D switching amplifier system employing a feedback loop.

A class D amplifier, also termed a switching amplifier, is an amplifier made of electronic components where the amplifying devices operate as electronic switches, instead of operating as gain devices as is common in other circuits. A class D amplifier operates by rapidly switching between open and closed states between the supply rails, and is often controlled by a modulator using pulse width modulation (PWM) which acts to transform an analog input signal into a pulse signal. The pulse signal is then passed through a filter, such as a low-pass filter, to an audio speaker. Switching amplifiers are highly efficient and can often exceed 85%-95% efficiency ratings.

It is desirable to have a high-performance class D amplifier which can handle both analog inputs as well as digital PWM inputs. The performance of the system is preferably not adversely affected by power supply noise or power stage nonlinearities. A feedback signal that is able to accomplish this should have high loop gain over the entire band of interest (for example, the audio band for class D audio amplifiers). Therefore, there is a need for a high performance class D amplifier which is capable of handling analog as well as digital PWM input signals in order to address a variety of applications.

BRIEF DESCRIPTION

In accordance with an embodiment of the present disclosure, herein is described a switching amplifier comprising a power supply configured to provide electrical power to the switching amplifier, a pulse modulator configured to modulate an input signal into a pulse width modulation signal, a switching stage configured to generate an amplified output signal using the input signal and the pulse width modulation signal, and an error feedback signal configured to correct errors in the amplified output signal, where the input signal is comprised of at least one of an analog signal and a digital signal. In some embodiments, the switching amplifier system also includes where the error feedback signal is comprised of a high order transfer function corresponding to an error between the input signal and a differential switching signal, where the high order is an order of two or greater. The switching amplifier system may also include where the high order transfer function is comprised of a plurality of op-amp circuits. The switching amplifier system may also include where the error feedback signal is generated by a combination of combinatorial logic and analog comparators. The switching amplifier system may also include where the error feedback signal is configured to have a value of zero at twice a switching frequency. The switching amplifier system may also include where the input signal is modulated using fixed frequency pulse width modulation. The switching amplifier system may also include where the input signal is modulated using variable frequency pulse width modulation. The switching amplifier system may also include where the digital signal is comprised of a pulse width modulation signal and where the digital signal is configured to latch the PWM output signal. The switching amplifier system may also include where the switching amplifier system is configured to detect a saturation event and generate a reset signal to reset the error feedback signal. The switching amplifier system may also include a digital clock, where the digital clock is configured to modulate a period of an analog pulse width modulation system to form analog spread spectrum pulse width modulation. The switching amplifier system may also include generating a digital spread spectrum signal by modifying a pulse code modulation corresponding to a pulse width modulation algorithm. The switching amplifier system may also include combinatorial logic to generate a saturation detection signal, where the saturation detection signal is generated when the switching amplifier system undergoes a saturation event. The switching amplifier system may also include a reset signal configured to reset the switching amplifier system upon detection of the saturation detection signal. The switching amplifier system may also include an oscillator and a ramp circuit configured to generate a pulse width modulation reference input signal based on a feedforward signal, where the oscillator generates a clock signal to generate the pulse width modulation output signal. The switching amplifier system may also include where the error feedback signal is generated by combining the feedforward signal, the amplified output signal, and the pulse width modulation reference input signal.

In accordance with an embodiment of the present disclosure, a method of signal amplification by a switching amplifier, comprising, in response to receiving an input signal, generating, by a pulse width modulator, a pulse width modulation signal, combining, by a switching stage, the input signal and the pulse width modulation signal to form an amplified output signal, and generating, by the switching stage, an error feedback signal, where the error feedback signal is configured to correct errors in the amplified output signal, and where the input signal is comprised of at least one of an analog signal and a digital signal. The method may also include generating, by the switching amplifier, a reset signal configured to reset the error feedback signal upon detection of a saturation event. The method may also include generating, by the switching amplifier, a digital spread spectrum signal by modifying the period of the pulse width modulated signal corresponding to a pulse width modulation algorithm. The method may also include generating, by combinatorial logic, a saturation detection signal, where the saturation detection signal is generated when the switching amplifier system undergoes a saturation event. The method may also include generating, by an oscillator and a ramp circuit, a pulse width modulation reference input signal based on a feedforward signal, where the oscillator generates a clock signal synchronized to a pulse width modulation reference input signal.

To further clarify the advantages and features of the present disclosure, a more particular description of the disclosure will follow by reference to specific embodiments thereof, which are illustrated in the appended figures. It is to be appreciated that these figures depict only typical embodiments of the disclosure and are therefore not to be considered limiting in scope. The disclosure will be described and explained with additional specificity and detail with the appended figures.

BRIEF DESCRIPTION OF THE DRAWINGS

The disclosure will be described and explained with additional specificity and detail with the accompanying figures in which.

Further, those skilled in the art will appreciate that elements in the figures are illustrated for simplicity and may not have necessarily been drawn to scale. Furthermore, in terms of the construction of the device, one or more components of the device may have been represented in the figures by conventional symbols, and the figures may show only those specific details that are pertinent to understanding the embodiments of the present disclosure so as not to obscure the figures with details that will be readily apparent to those skilled in the art having the benefit of the description herein.

DETAILED DESCRIPTION

For the purpose of promoting an understanding of the principles of the disclosure, reference will now be made to the embodiment illustrated in the figures and specific language will be used to describe them. It will nevertheless be understood that no limitation of the scope of the disclosure is thereby intended. Such alterations and further modifications in the illustrated system, and such further applications of the principles of the disclosure as would normally occur to those skilled in the art are to be construed as being within the scope of the present disclosure.

The terms "comprises", "comprising", or any other variations thereof, are intended to cover a non-exclusive inclusion, such that a process or method that comprises a list of steps does not include only those steps but may include other steps not expressly listed or inherent to such a process or method. Similarly, one or more devices or sub-systems or elements or structures or components preceded by "comprises . . . a" does not, without more constraints, preclude the existence of other devices, sub-systems, elements, structures, components, additional devices, additional sub-systems, additional elements, additional structures, or additional components. Appearances of the phrase "in an embodiment", "in another embodiment" and similar language throughout this specification may, but not necessarily do, all refer to the same embodiment.

Unless otherwise defined, all technical and scientific terms used herein have the same meaning as commonly understood by those skilled in the art to which this disclosure belongs. The system, methods, and examples provided herein are only illustrative and not intended to be limiting.

In the following specification and the claims, reference will be made to a number of terms, which shall be defined to have the following meanings. The singular forms "a", "an", and "the" include plural references unless the context clearly dictates otherwise.

Figure 1:
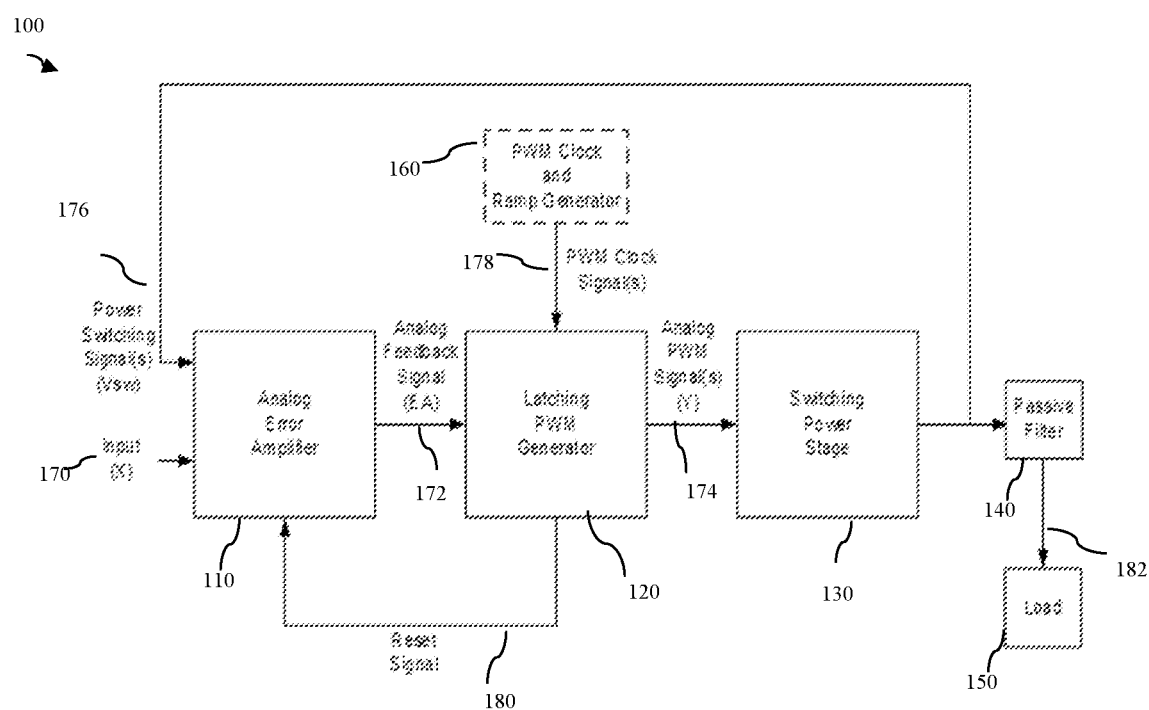
FIG. 1 is a block diagram of a switching amplifier system in accordance with an embodiment of the present disclosure.

FIG. 1 is a block diagram of a switching amplifier system 100 in accordance with an embodiment of the present disclosure. Switching amplifier system 100 includes an analog error amplifier 110, a latching PWM generator 120, a switching power stage 130, a passive filter 140, and an electrical load 150. The switching amplifier system 100 also includes a number of signals, to include an output/feedback or power switching signal (Vsw) 176. An input (X) signal 170 is also present, where the input signal (X) 170 is, alternatively, an analog signal or a digital signal. The analog error amplifier 110 generates an analog feedback signal (EA) 172. Meanwhile, the latching PWM generator 120 generates an analog PWM signal (Y) 174. According to some embodiments, the latching PWM generator 120 also generates a reset signal 180 which is sent to the analog error amplifier 110 when a saturation event occurs. Meanwhile, the switching power stage 130 receives the analog PWM signal (Y) 174 from the latching PWM generator 120 and generates the power switching signal (Vsw) 176 that is both sent to the passive filter 140 and also is used as a feedback signal to the analog error amplifier 110 as described herein. Finally, the passive filter 140 filters the incoming signal and sends the filtered and amplified audio output signal 182 to the load 150 to drive a loudspeaker, an electrical circuit, listening equipment, and the like.

According to some embodiments, the switching amplifier system 100 also includes a PWM clock and ramp generator 160 that is configured to generate one or more PWM clock or oscillator signals 178 which is received by the latching PWM generator 120.

According to some embodiments, it is possible to apply the present disclosure to a spread spectrum signal. In order to do so, the following modifications are required. For an analog input signal, the latching PWM generator 120 requires a ramp generator and an associated digital clock/oscillator. By modulating the period of the PWM slowly, the system will produce analog spread spectrum PWM. For a digital input signal, the input digital PWM signal (X) has period of the PWM that is not constant and time varying, the system will produce digital spread spectrum PWM.

Figure 2:
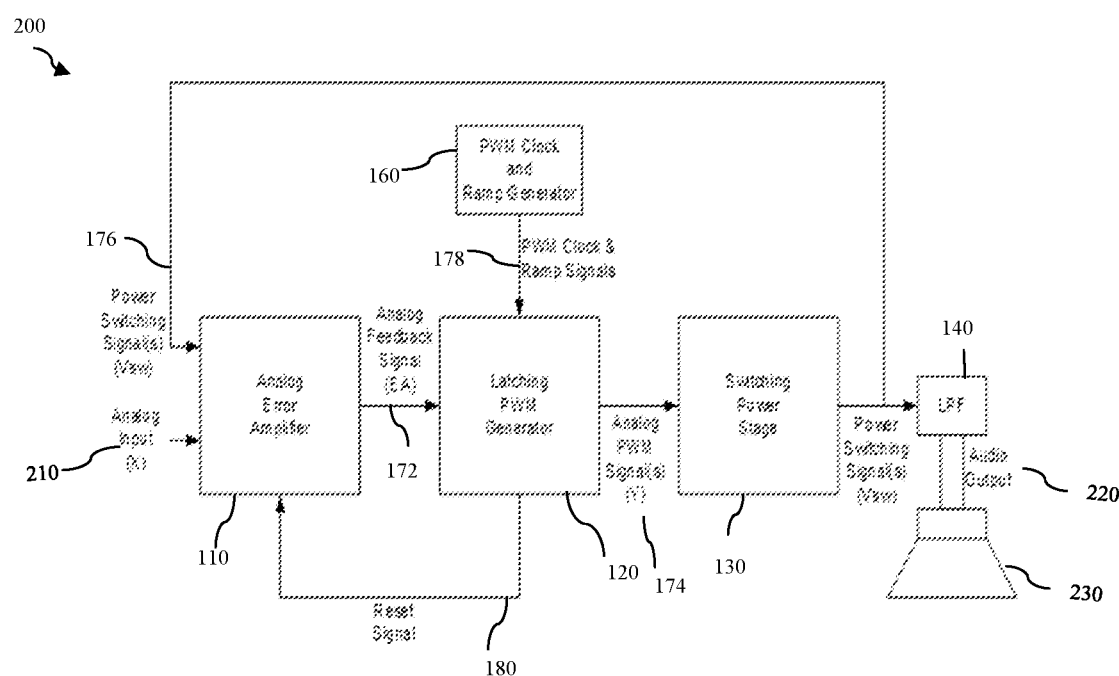
FIG. 2 illustrates a block diagram of the switching amplifier system 100 of FIG. 1 using an analog signal as an input in accordance with an embodiment of the present disclosure.

FIG. 2 illustrates a block diagram of a switching amplifier system 200 in accordance with an embodiment of the present disclosure. FIG. 2 illustrates similar components, signals, and modules as the switching amplifier system 100 FIG. 1 but instead discloses using an analog signal 210 as an input signal (X) 170 and an audio monitor or loudspeaker 230 as an electrical load. According to some embodiments, the audio output signal 220 is a filtered and amplified analog signal.

To maintain high loop gain over the entire audio band, a higher order feedback loop is used. The higher order feedback loop, such as Analog Error Amplifier 110 of FIG. 1, corrects for both the nonlinearity of the switching class D power stage 130 and the noise in the power supply feeding the switching class D power stage 130. The switching amplifier system 100 works for both analog audio and digital PWM inputs. The Analog Feedback signal 172 is a feedback signal and is represented by a higher order transfer function corresponding to the error present between the input (X) signal 210 and the differential switching signal. The transfer function can be implemented by a few op-amp circuits. The Analog PWM signal (Y) 174 is used to create the PWM signals driving the switching power stage 130 using a combination of combinatorial logic and analog comparators. The Analog Feedback signal 172 is essentially set to zero at twice the switching frequency of the switching amplifier system 100. This sets the performance of the switching amplifier system 100 to a very high level with a system of order two or greater.

The higher order system is not guaranteed to be stable if there is a saturation event. The duty ratios by definition are constrained to be in the range from zero to one. Thus, a saturation event is a likely scenario if the volume is pushed high enough. To maintain stability and fast recovery from the saturation event without audible artifacts at the load 150, it is necessary to detect the saturation event within the first half cycle. This is accomplished using combinatorial logic which is both fast and low cost in both discrete and integrated implementations. The saturation detection circuitry is part of the latching PWM generator 120 and is used to reset the analog error amplifier 110 in the higher order Analog Error Amplifier 110. The system is capable of handling both fixed and variable switching frequency PWM signals.

In the switching amplifier system 200 with an analog input (X) 210, the PWM clock and ramp generator 160 creates the PWM clock and ramp signal 178 that includes a ramp with linear slope and a feedforward term that mathematically creates the equivalent of a PWM reference input to the latching PWM generator 120. The PWM clock portion of the PWM clock and ramp signal 178 is used to create a digital clock synchronized with the ramp signal.

Figure 4:
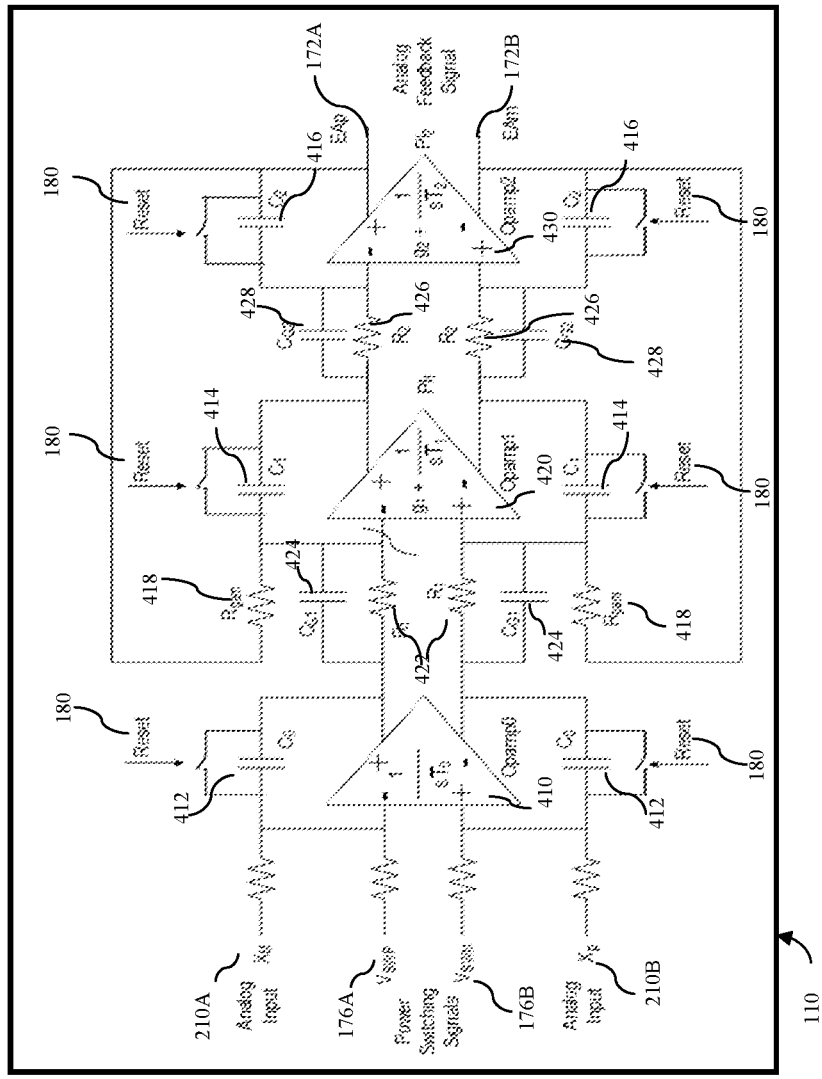
FIG. 4 is a block diagram of an error amplifier with an analog signal input in accordance with an embodiment of the present disclosure.

Continuing with FIG. 4, a mathematical analysis of an analog PWM is intended. The first integrator output is of the form:

$$I_0 = \frac{\int [X - vsw]dt}{T_0} = \frac{\int [(Xp - Xm) - (Vswp - Vswm)]dt}{T_0} \quad \text{(eq. 1)}$$

By defining X as the input and Vsw as the output, the expression can be simplified as:

$$PI_1 = \frac{1}{T_1}\int I_1 dt + g_1 I_0 - \gamma \cdot PI_2 \quad \text{(eq. 2)}$$

$$\text{Error Feedback Signal} = PI_2 = \frac{1}{T_2}\int PI_1 dt + g_2 \cdot PI_1 \quad \text{(eq. 3)}$$

Ignoring γ, the overall transfer function of the error amplifier can be defined to be:

$$H(s) = \frac{1}{sT_0}\left(g_1 + \frac{1}{sT_1}\right)\left(g_2 + \frac{1}{sT_2}\right) \quad \text{(eq. 4)}$$

The magnitude of the signal is irrelevant since the output feeds a comparator. Without changing the system transfer function, we can set the time constants to the same value and we are left with only two independent variables: g1 and g2. $T_0=T_1=T_2=T$ where T may be chosen to be equal to a PWM half cycle. The resulting system has two independent variables g1 and g2. These two design variables g1 and g2 are used to optimize performance.

The composite error signal is a linear combination of a feedforward term, the error amplifier output, and the ramp.

$$\text{Composite Error Signal} = PI_2 + (Vacp - Vacm) - \text{Ramp} = \quad \text{(eq. 5)}$$

$$\frac{1}{sT_0}\left(g_1 + \frac{1}{sT_1}\right)\left(g_2 + \frac{1}{sT_2}\right)(X - Vsw) + (V_{ref} - \text{Ramp})$$

If the difference between the reference input Vref and the Ramp, when passed through the comparator, produces ideal PWM, then it can be approximated to X plus the switching noise "$N_A$". Taking this approximation, we get the following equation:

$$Vsw = \frac{1}{sT}\left(g_1 + \frac{1}{sT}\right)\left(g_2 + \frac{1}{sT}\right)(X - Vsw) + (X + N_A) \quad \text{(eq. 6)}$$

Combining terms, we get the following terms including the switching noise of the PWM $N_A$.

$$\left[1 + \frac{1}{sT}\left(g_1 + \frac{1}{sT}\right)\left(g_2 + \frac{1}{sT}\right)\right](X - Vsw) + N_A = 0 \quad \text{(eq. 7)}$$

$$Vsw = X + N_A / \left[1 + \frac{1}{sT}\left(g_1 + \frac{1}{sT}\right)\left(g_2 + \frac{1}{sT}\right)\right] \quad \text{(eq. 8)}$$

The term γ makes a null in the noise transfer function at a frequency proportional to the switching frequency and γ. The noise due to the PWM process $N_A$ can be significant in the audio band, but this noise is divided by the gain of the error amplifier which is very high in the audio band. This can be made even higher over the entire audio band by appropriate choice of the term γ. The output spectrum plots show a null in the noise transfer function based on the value of the term γ.

In a similar manner as described in FIG. 1, it is possible to apply the present disclosure to a spread spectrum signal. For a digital input signal, the digital spread spectrum can be implemented by modifying a PCM to PWM algorithm. In both analog and digital cases, the feedback is able to operate just like a fixed frequency PWM.

Figure 3:
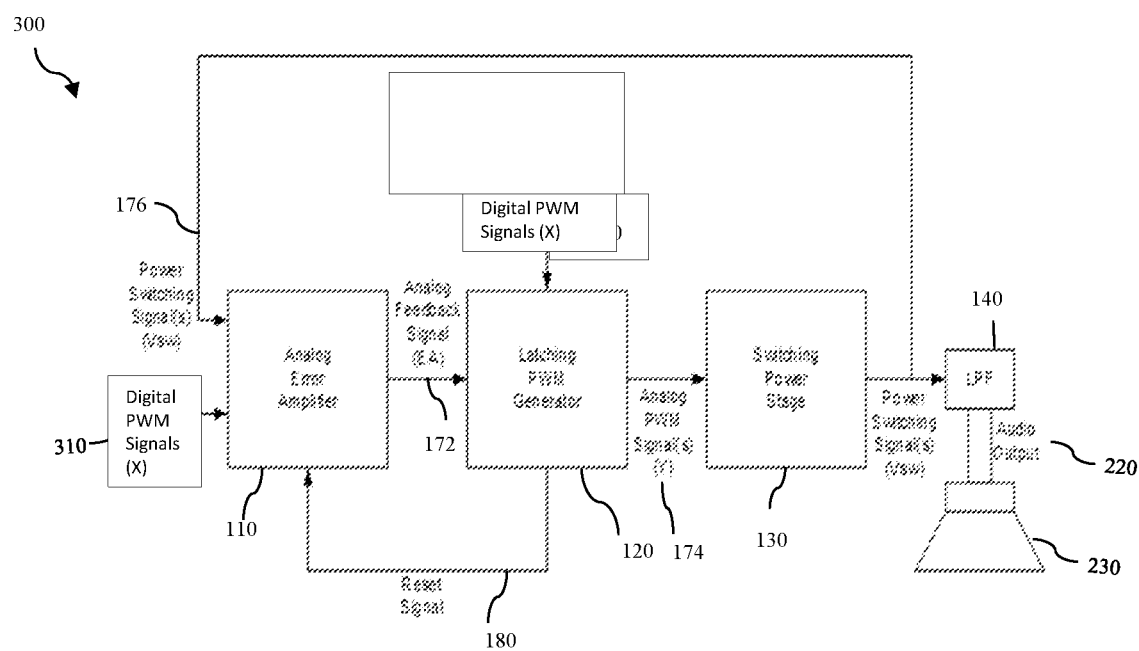
FIG. 3 illustrates a block diagram of the switching amplifier system 100 of FIG. 1 using a digital PWM signal as an input in accordance with an embodiment of the present disclosure.

FIG. 3 illustrates a block diagram of a switching amplifier system 300 using a digital PWM signal 310 as an input in accordance with an embodiment of the present disclosure. According to some embodiments, in the switching amplifier system 300 with digital PWM input signal (X) 310, the performance using the digital PWM input signal (X) 310 is considered ideal, and the system drives the differential switching signals to equal the digital PWM input signal (X) 310 in the audio band. Using the latching PWM generator 120, the digital PWM input signals (X) 310 are used to latch the audio PWM signal (Y) 174 as well as detect a saturation event and reset the higher order error feedback signal. Using the reset signal 180.

This following is a mathematical analysis of digital PWM as it pertains to the system of FIG. 3.

First op-amp output is $I_0$:

$$I_0 = \frac{\int[(Xp - Xm) - (Vswp - Vswm)]dt}{T_0} = \frac{\int[X - Vsw]dt}{T_0} \quad \text{(eq. 9)}$$

First Proportional plus Integral output is $PI_1$:

$$PI_1 = \frac{1}{T_1}\int I_0 dt + g_1 I_0 - \gamma \cdot PI_2 \quad \text{(eq. 10)}$$

Second Proportional plus Integral output is $PI_2$ which is also the Error Feedback Signal:

$$PI_2 = \frac{1}{T_2}\int PI_1 dt + g_2 \cdot PI_1 \quad \text{(eq. 11)}$$

Ignoring the $\gamma$ term from $PI_2$ that is fed back into $PI_1$ we can express the transfer function as:

$$H(s) = \frac{1}{sT_0}\left(g_1 + \frac{1}{sT_1}\right)\left(g_2 + \frac{1}{sT_2}\right) \quad \text{(eq. 12)}$$

The magnitude of the signal is irrelevant since the output feeds a comparator. Without changing the system transfer function, we can set the time constants to the same value and we are left with only two independent variables $g_1$ and $g_2$. $T_0=T_1=T_2=T$, where T may be chosen to be equal to a PWM half cycle. The resulting system has two independent variables: $g_1$ and $g_2$. These two design variables g1 and g2 can be used to optimize the performance. Table (3) shows data on the impact of these variable on the performance of the system.

$$\text{Error Amplifier} = \frac{1}{sT0}\left(g_1 + \frac{1}{sT_1}\right)\left(g_2 + \frac{1}{sT_2}\right)(X - Vsw) \quad \text{(eq. 13)}$$

Under normal operation, the error is small. Under small signal conditions, linearization can be used to approximate Y. Y is the sum of input X, the error amplifier output, and the noise of the PWM system.

$$Vsw = \frac{1}{sT}\left(g_1 + \frac{1}{sT}\right)\left(g_2 + \frac{1}{sT}\right)[X - Vsw] + X + N_D \quad \text{(eq. 14)}$$

where ND represents the switching noise of the system:

$$\left[1 + \frac{1}{sT}\left(g_1 + \frac{1}{sT}\right)\left(g_2 + \frac{1}{sT}\right)\right](X - Vsw) + N_D = 0 \quad \text{(eq. 15)}$$

$$Vsw = X + N_D / \left[1 + \frac{1}{sT}\left(g_1 + \frac{1}{sT}\right)\left(g_2 + \frac{1}{sT}\right)\right] \quad \text{(eq. 16)}$$

The term $\gamma$ makes a null in the noise transfer function at a frequency proportional to the switching frequency and $\gamma$.

FIG. 4 is a block schematic diagram of an analog error amplifier 110 with an analog signal input (X) 210 in accordance with an embodiment of the present disclosure. According to some embodiments, analog input signal (X) 210 is represented by two complementary signals, $X_M$ 210A and $X_P$ 210B. In some embodiments, analog error amplifier 110 is comprised of a cascade of op-amps 0, 1, and 2 (410, 420, 430 respectively). Op-amp 410 has a corresponding set of capacitors 412 and resistors. In a similar fashion, op-amp 420 is associated with capacitors 414, 424 and resistors 418, 422. Op-amp 430 is associated with capacitors 416, 428 and resistors 426. All three op-amps 410, 420, 430 accept as an input the reset signal 180 from latching PWM generator 120 to reset the analog error amplifier 110 whenever a saturation event has been detected.

Continuing with FIG. 4, the analog error amplifier 110 accepts as inputs the analog input signals (X) 210A, 210B as well as the power switching signal (Vsw) 176A, 176B from the switching power stage 130 as described above. The difference between the analog input signals (X) 210A, 210B and the power switching signal (Vsw) 176A, 176B acts as a feedback error signal to allow correction of errors in the amplified signals. Each op-amp applies a proportional and integral gain value to the incoming signals, producing an amplified output signal termed the analog feedback signal (EA) 172A, 172B, which is sent to the latching PWM generator 120. The gain of each stage is marked up on the individual op-amp. The gains are set by the capacitor and resistor values.

Figures 5A, 5B:
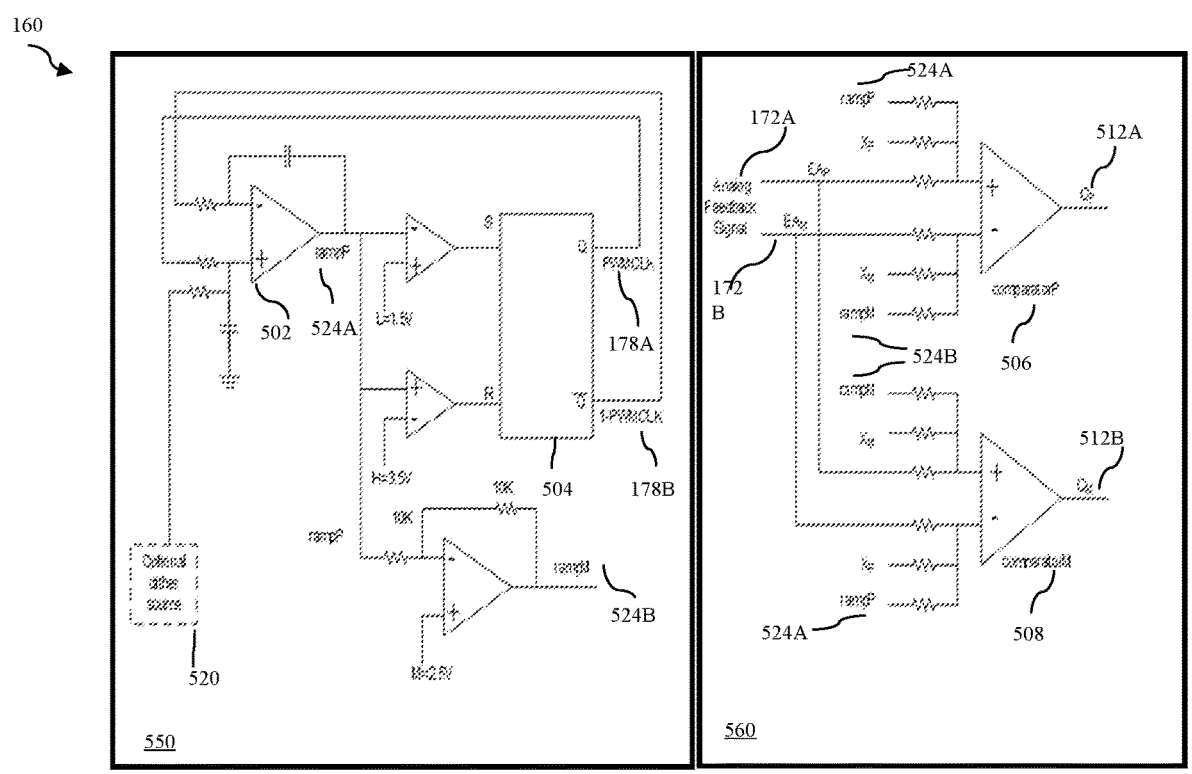
FIG. 5A is a block diagram of a clock generator with an analog signal input in accordance with an embodiment of the present disclosure.
FIG. 5B is a block diagram of comparators for a Class D amplifier with an analog signal input in accordance with an embodiment of the present disclosure.

FIG. 5A is a block schematic diagram of the PWM clock and ramp generator 160 in accordance with an embodiment of the present disclosure. The PWM clock and ramp generator 160 (disclosed in FIG. 1) is comprised of two parts: a PWM clock circuit and a ramp circuit 550. The PWM clock circuit 550 uses a SR latch 504 to switch from one output to another to generate the PWM clock signal 178A, 178B. The op-amp 502 which generates a ramp signal "rampP" 524A using an integrator topology and combined with the SR latch 504 as an oscillator. According to some embodiments, the PWM clock circuit 550 also includes, as an input, a dither source 520 to add white noise to op-amp 502 in an effort to produce spread spectrum PWM signals.

Continuing with FIG. 5B, the Class D comparator circuit 560 includes two comparators comparatorP and comparatorM (506, 508 respectively). The circuit 560 accepts as an input the analog feedback signals 172A, 172B and the rampP signal 524A, rampM signal 524B and generates as an output logic signals Cp and Cm (512A, 512B respectively), which are sent to the latching PWM generator 120 as disclosed herein.

Figure 6:
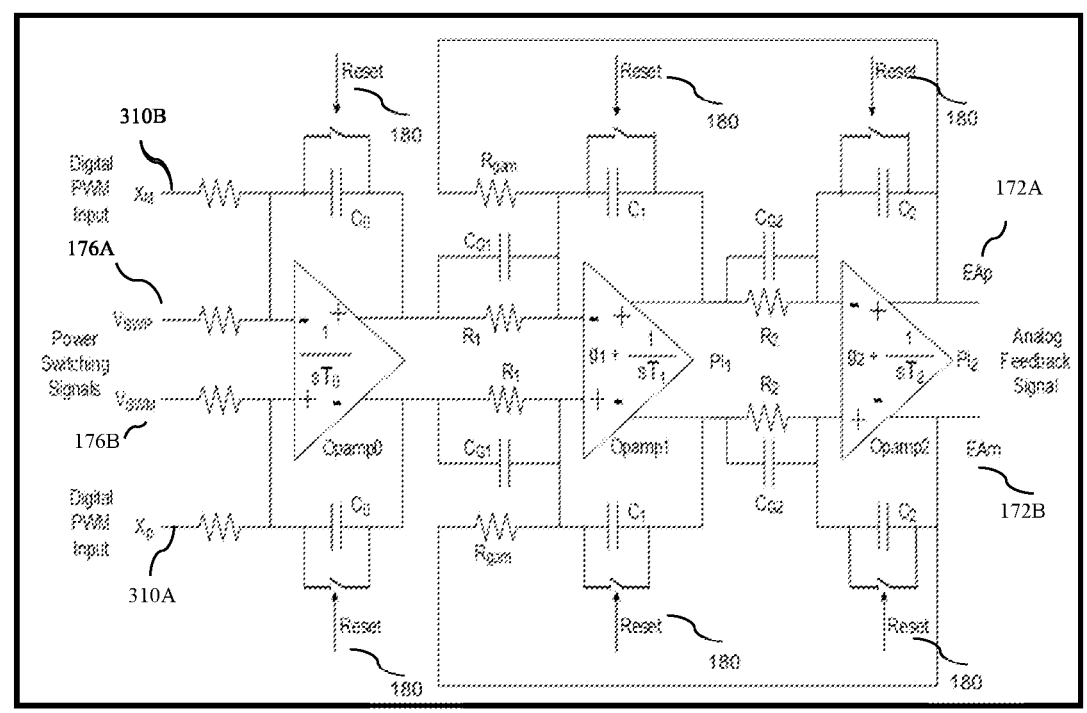
FIG. 6 is a block diagram of an error amplifier with a digital PWM signal input in accordance with an embodiment of the present disclosure.

FIG. 6 is a block schematic diagram of the error amplifier 110 with a digital PWM signal inputs Xp and Xm (310A, 310B respectively) in accordance with an embodiment of the present disclosure. The error amplifier 110 of FIG. 6 operates in a similar fashion as the error amplifier 110 as described in FIG. 4, but instead uses digital PWM signals as an input. The output of the error amplifier 110 remains the same, being analog feedback signals 172A, 172B, which are sent to the latching PWM generator 120. According to some embodiments, the digital PWM signal inputs Xp may be replaced by the complement of Xm and the digital PWM signal inputs Xm may be replaced by the complement of Xp. This reduces the switching frequency components in the common mode signal input to the error amplifier while making no change to the differential signals.

Figure 7:
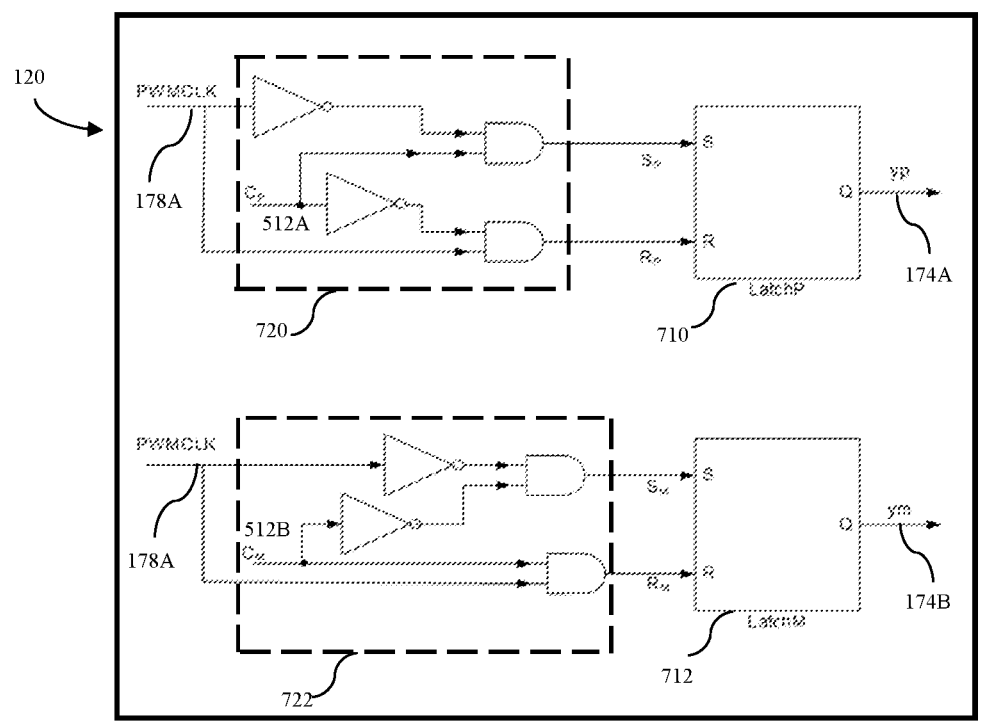
FIG. 7 is a block diagram of a latching PWM generator with an analog signal input in accordance with an embodiment of the present disclosure.

FIG. 7 is a block schematic diagram of the latching PWM generator 120 using an analog signal as described in FIG. 2 and using a PWM clock signal input PWMCLK 178A in accordance with an embodiment of the present disclosure. The latching PWM generator 120 includes discrete logic 720, 722 to latch the PWM output to the frequency of the PWM clock signal a set of SR latches labelled latchP and latchM (710, 712, respectively). The output of the SR latches are analog PWM signals with continuously variable duty ratios Yp and Ym (174A, 174B, respectively). The analog PWM signals 174A, 174B are sent to the switching power stage 130 as described in FIGS. 1 and 2.

Figure 8:
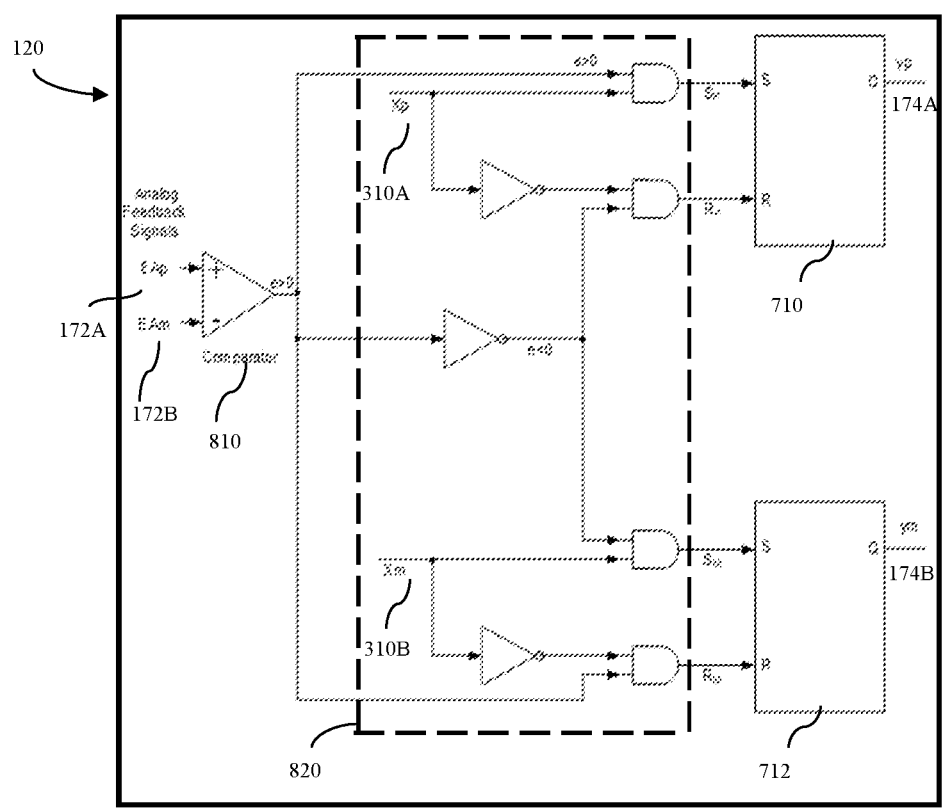
FIG. 8 is a block diagram of a latching PWM generator with a digital signal input in accordance with an embodiment of the present disclosure.

FIG. 8 is a block schematic diagram of the latching PWM generator 120 using a digital PWM input signal as described in FIG. 3 and using analog feedback signals 172A, 172B in accordance with an embodiment of the present disclosure. FIG. 8 operates in a manner similar to the generator described in FIG. 7, but also includes a comparator 810 that compares the analog feedback signals 172A, 172B and generates an output that is a logic "high" or "low" depending on which input signal is more positive. In the analog input case there are two comparators as shown in FIG. 5B 560. The output of the comparator 810 is sent to a series of logic gates 820 which then feeds the inputs to two SR latches 710, 712. The output of SR latches 710, 712 are analog PWM signals Yp and Ym (174A, 174B respectively), which are sent to the switching power stage 130. The logic gates 820 force the PWM signals Yp and Ym (174A, 174B respectively) have the same switching frequency as the digital PWM input signals Xp and Xm (310A, 310B respectively).

Figure 9:
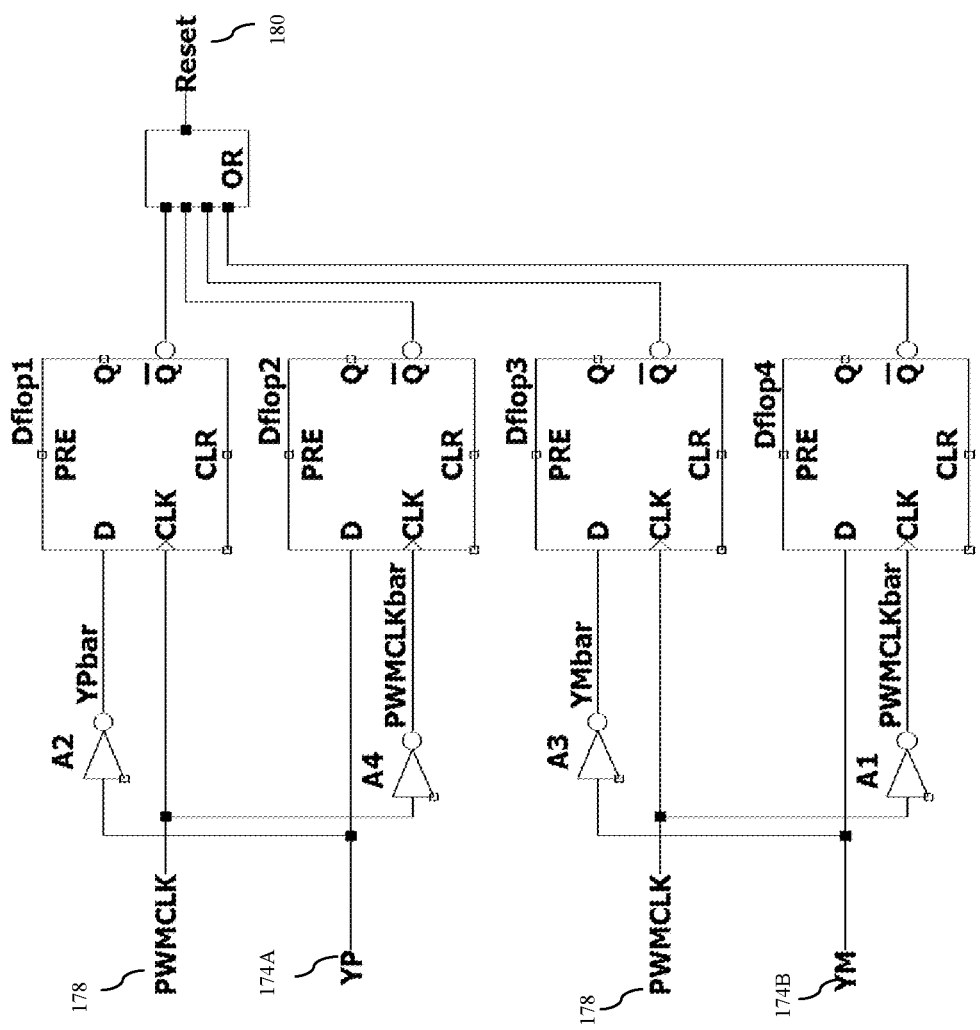
FIG. 9 is a block diagram of the Reset Signal Generator for a system with an analog input.

FIG. 9 is a block diagram of the reset signal generator for a system with an analog input. This generates the reset signals 180 in FIG. 1. This takes PWM signals 174A and 174B and clock signal PWMCLK 178 as input and generates reset signal 180 for Error Amplifier 110 in case of saturation of the Amplifier.

Figure 10:
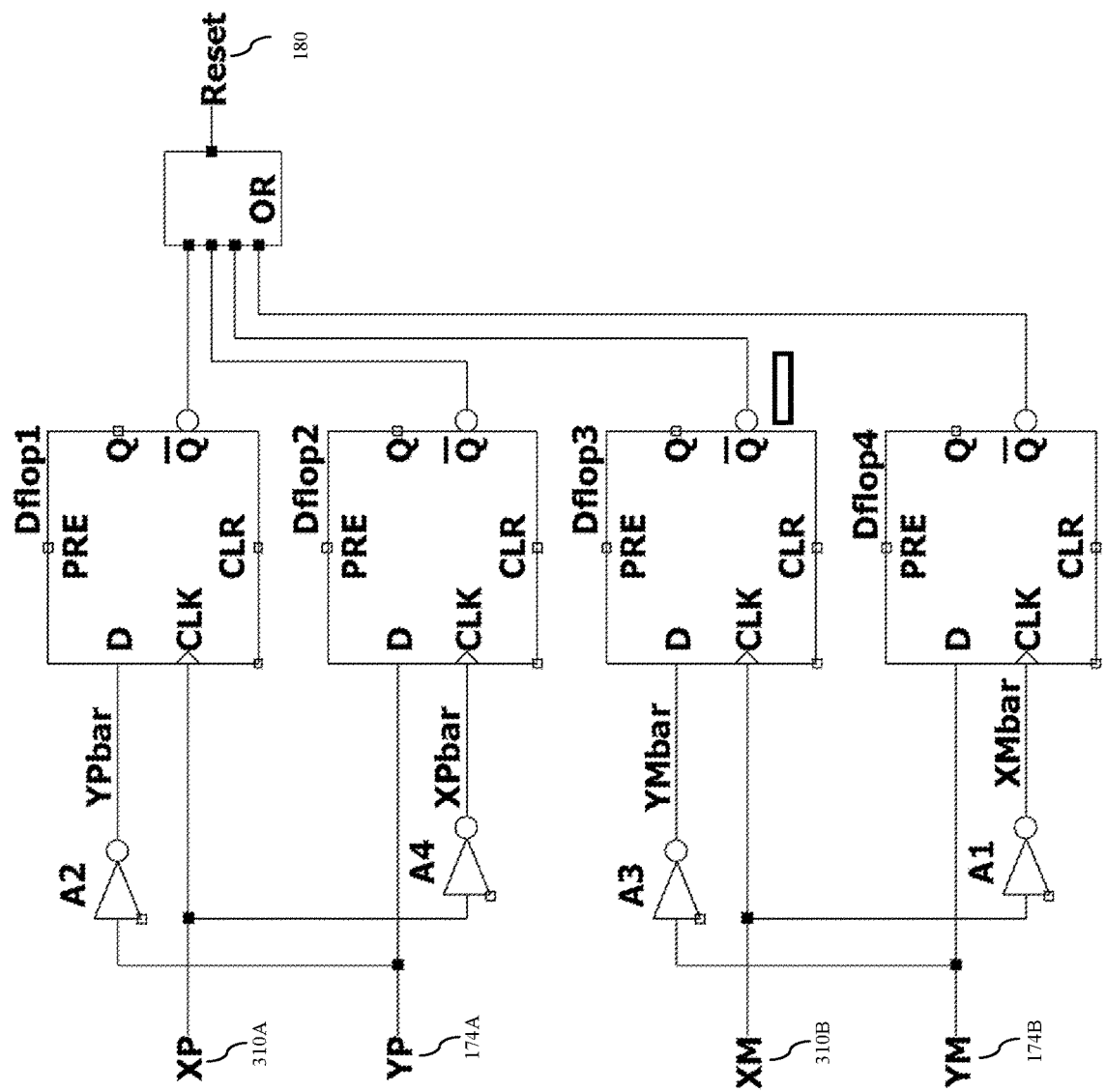
FIG. 10 is a block diagram of the Reset Signal Generator for a system with a digital input.

FIG. 10 is a block diagram of the reset signal generator for a system with a digital input. This generates the reset signals 180 in FIG. 1. This takes PWM signals 174A and 174B and digital PWM signals 310A and 310B as inputs and generates reset signals 180 for Error Amplifier 110 in case of saturation of the Amplifier.

Figure 11:
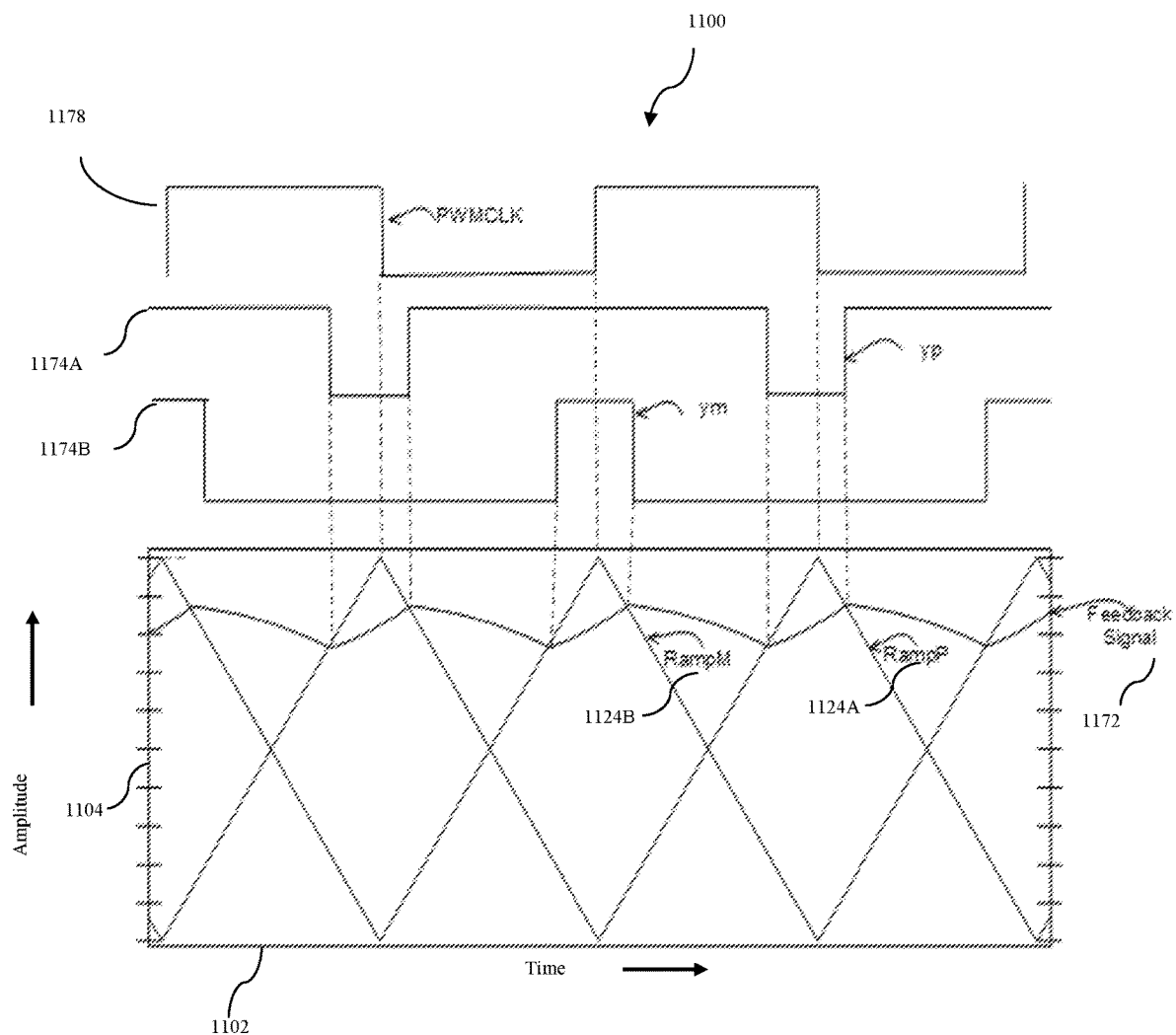
FIG. 11 illustrates PWM signals for an analog input in accordance with an embodiment of the present disclosure.

FIG. 11 illustrates graphs 1100 of PWM signals for an analog input in accordance with an embodiment of the present disclosure. Graph 1100 includes an x-axis 1102 labeled "time" and a y-axis 1104 labelled amplitude. The first trace 1124A represents the ramp signal rampP 524A as disclosed in FIG. 5A and is a sawtooth waveform that begins at amplitude 0 at time 0. Concurrently, a second trace 1124B of the rampM signal 524B begins at maximum amplitude at time 0. Also shown is trace 1172 of the resultant feedback (EA) 172. Trace 1130 (EA) is formed from the difference of the input signal (X) and the power switching signals (Vsw).

TABLE 1

Delay Encoding Table

Table 1 is titled "Delay Encoding Table: Rising/Falling Edge; duty ratio value (dp) and Error (e) polarity". The key idea is that only a delay is possible and only one of the two PWM signals needs to be delayed as a function of duty ratio and polarity of the error signal (EA).

| Edge | Duty Ratio | Error Amplifier Output (EA) | Delay |
|---|---|---|---|
| Rising | $dp > \frac{1}{2}$ | >0 | ym |
| Rising | $dp < \frac{1}{2}$ | >0 | yp |

TABLE 1-continued

Delay Encoding Table

Table 1 is titled "Delay Encoding Table: Rising/Falling Edge; duty ratio value (dp) and Error (e) polarity". The key idea is that only a delay is possible and only one of the two PWM signals needs to be delayed as a function of duty ratio and polarity of the error signal (EA).

| Edge | Duty Ratio | Error Amplifier Output (EA) | Delay |
|---|---|---|---|
| Rising | $dp > \frac{1}{2}$ | <0 | yp |
| Rising | $dp < \frac{1}{2}$ | <0 | ym |
| Falling | $dp > \frac{1}{2}$ | >0 | yp |
| Falling | $dp < \frac{1}{2}$ | >0 | ym |
| Falling | $dp > \frac{1}{2}$ | <0 | ym |
| Falling | $dp < \frac{1}{2}$ | <0 | yp |

Figure 12A:
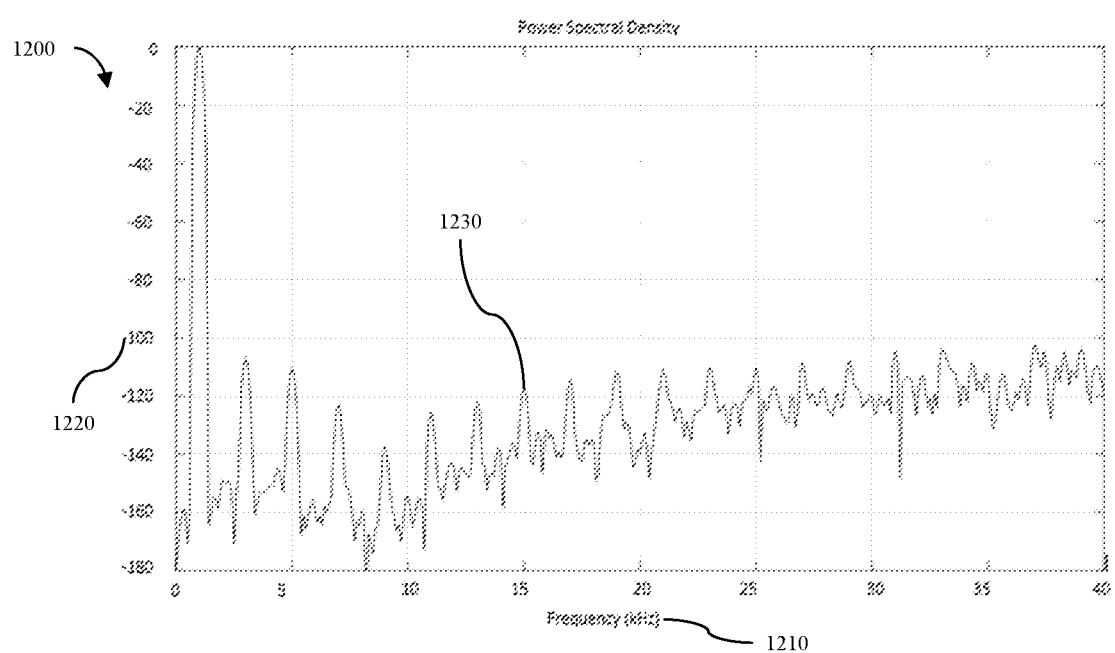
FIGS. 12A and 12B are graphs of an output spectrum for analog and digital signal inputs, respectively, in accordance with an embodiment of the present disclosure.
Figure 12B:
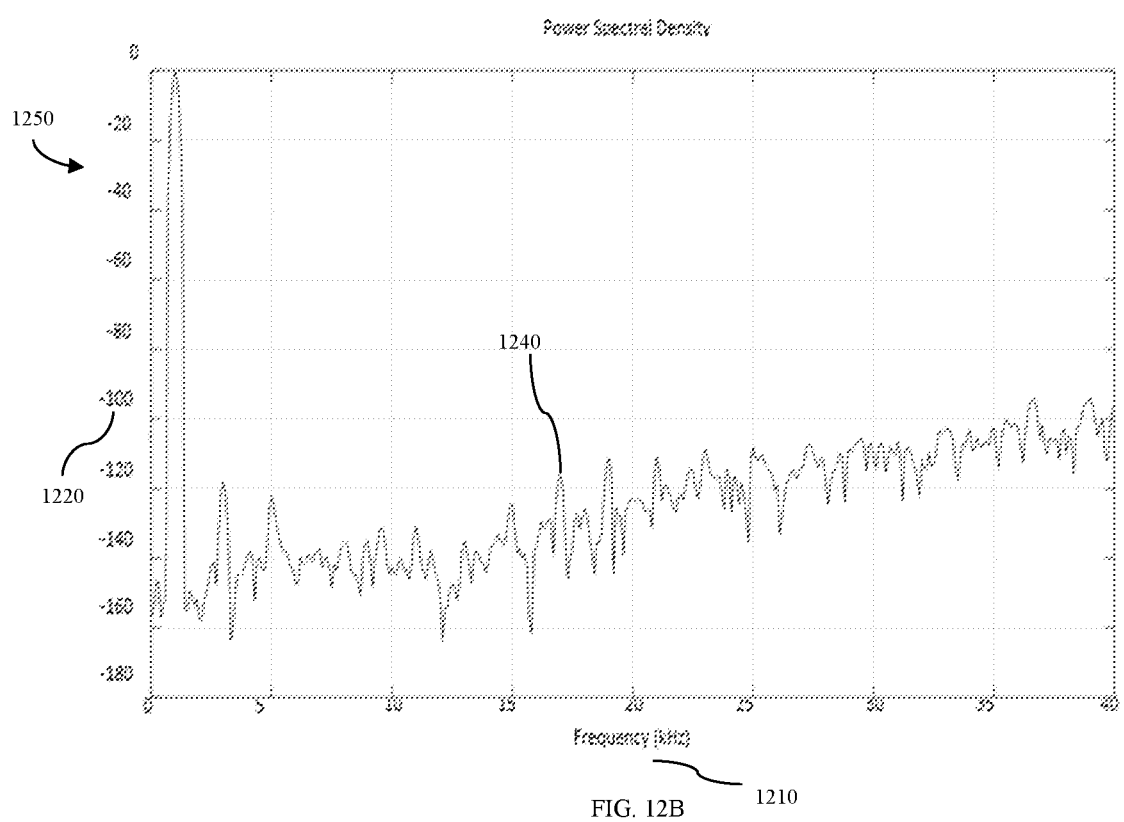

FIGS. 12A and 12B are graphs 1200, 1250 respectively of output spectrums for analog 1230 and digital signals 1240, respectively, in accordance with an embodiment of the present disclosure. Both graphs 1200 and 1250 are plotted on a chart with an x-axis 1210 plotted in increasing frequency and a y-axis 1220 plotted in decibels (relative power). Waveform 1230 represents the output spectrum for the switching amplifier system 100 with an analog input. Likewise, waveform 1240 represents the output spectrum for the switching amplifier system 100 with a digital input.

Table 2 below is titled "Impact of Error Amplifier Gains for system with Analog Input". The objective is to maximize SNR. Low SNR number indicate instability or nonoptimal designs. The SNR results show not only high performance but also a relatively wide range of values in the neighbourhood of optimal values where the performance is good indicating robustness of the solution.

TABLE 2

Impact of Error Amplifier Gains for System with Analog Input

| g1 | g2 | SNR (dB) |
|---|---|---|
| 0.75 | 0.75 | −29 |
| 0.75 | 1 | 108 |
| 0.75 | 1.5 | 107 |
| 0.75 | 2 | 106 |
| 1 | 0.75 | 108 |
| 1 | 1 | 108 |
| 1 | 1.5 | 107 |
| 1 | 2 | 105 |
| 1.5 | 0.75 | 107 |
| 1.5 | 1 | 107 |
| 1.5 | 1.5 | 105 |
| 1.5 | 2 | 103 |
| 2 | 0.75 | 106 |
| 2 | 1 | 105 |
| 2 | 1.5 | 103 |
| 2 | 2 | 97 |

Table 3 is labelled "Impact of Error Amplifier Gains on system with Digital Input" as disclosed in FIG. 3. The objective is to maximize SNR. Low SNR number indicate instability or nonoptimal designs. The SNR results show not only high performance but also a relatively wide range of values in the neighbourhood of optimal values where the performance is good indicating robustness of the solution.

The variance of Duty Ratio is not desirable, and a combination of high SNR and low variance is an optimal design.

TABLE 3

Impact of Error Amplifier Gains on System with Digital Input

| g1 | g2 | SNR(dB) | Variance of Duty Ratio |
|---|---|---|---|
| 0.5 | 0.5 | 17.4 | 1.031 |
| 1 | 0.5 | 100.3 | 0.163 |
| 1.5 | 0.5 | 100.6 | 0.107 |
| 2 | 0.5 | 101.7 | 0.082 |
| 0.5 | 1 | 100.5 | 0.158 |
| 1 | 1 | 108.9 | 0.035 |
| 1.5 | 1 | 108.1 | 0.021 |
| 2 | 1 | 105.2 | 0.017 |
| 0.5 | 1.5 | 100.8 | 0.107 |
| 1 | 1.5 | 108.3 | 0.021 |
| 1.5 | 1.5 | 105.1 | 0.015 |
| 2 | 1.5 | 102.2 | 0.013 |
| 0.5 | 2 | 101.9 | 0.079 |
| 1 | 2 | 105.4 | 0.017 |
| 1.5 | 2 | 102.3 | 0.013 |
| 2 | 2 | 99.9 | 0.011 |

It will be understood by those skilled in the art that the foregoing general description and the following detailed description are exemplary and explanatory of the disclosure and are not intended to be restrictive thereof.

While specific language has been used to describe the disclosure, any limitations arising on account of the same are not intended. As would be apparent to a person skilled in the art, various working modifications may be made to the method in order to implement the inventive concept as taught herein.

The figures and the foregoing description give examples of embodiments. Those skilled in the art will appreciate that one or more of the described elements may well be combined into a single functional element. Alternatively, certain elements may be split into multiple functional elements. Elements from one embodiment may be added to another embodiment. For example, the order of processes described herein may be changed and are not limited to the manner described herein. Moreover, the actions of any flow diagram need not be implemented in the order shown; nor do all of the acts need to be necessarily performed. Also, those acts that are not dependent on other acts may be performed in parallel with the other acts. The scope of embodiments is by no means limited by these specific examples.

We claim:

1. A switching amplifier system, comprising:
a power supply configured to provide electrical power to the switching amplifier system;
a pulse width modulator configured to modulate an input signal into a pulse width modulation signal;
a switching stage configured to generate an amplified output signal using the input signal and the pulse width modulation signal; and
an error feedback signal configured to correct errors in the amplified output signal, wherein the input signal is comprised of at least one of an analog signal and a digital signal,
wherein the switching amplifier system is configured to detect a saturation event and generate a reset signal to reset the error feedback signal.

2. The switching amplifier system of claim 1, wherein the error feedback signal is comprised of a high order transfer function corresponding to an error between the input signal and a differential switching signal, wherein the high order is an order of two or greater.

3. The switching amplifier system of claim 2, wherein the high order transfer function is comprised of a plurality of op-amp circuits.

4. The switching amplifier system of claim 1, wherein the error feedback signal is generated by a combination of combinatorial logic and analog comparators.

5. The switching amplifier system of claim 1, wherein the error feedback signal is configured to have a value of zero at twice a switching frequency.

6. The switching amplifier system of claim 1, wherein the input signal is modulated using fixed frequency pulse width modulation.

7. The switching amplifier system of claim 1, wherein the input signal is modulated using variable frequency pulse width modulation.

8. The switching amplifier system of claim 1, wherein the digital signal is comprised of a pulse width modulation signal and wherein the digital signal is configured to latch the amplified output signal.

9. The switching amplifier system of claim 1, further comprising a digital clock, wherein the digital clock is configured to modulate a period of an analog pulse width modulation system to form analog spread spectrum pulse width modulation.

10. The switching amplifier system of claim 1, further comprising generating a digital spread spectrum signal by modifying a pulse code modulation corresponding to a pulse width modulation algorithm.

11. The switching amplifier system of claim 1, further comprising combinatorial logic to generate a saturation detection signal, wherein the saturation detection signal is generated when the switching amplifier system undergoes a saturation event.

12. The switching amplifier system of claim 11, further comprising a reset signal configured to reset the switching amplifier system upon detection of the saturation detection signal.

13. The switching amplifier system of claim 1, further comprising an oscillator and a ramp circuit configured to generate a pulse width modulation reference input signal based on a feedforward signal, wherein the oscillator generates a clock signal synchronized to the pulse width modulation reference input signal.

14. The switching amplifier system of claim 13, wherein the error feedback signal is generated by combining the feedforward signal, the amplified output signal, and the pulse width modulation reference input signal.

15. A method of signal amplification by a switching amplifier system, comprising, in response to receiving an input signal:
generating, by a pulse width modulator, a pulse width modulation signal;
combining, by a switching stage, the input signal, and the pulse width modulation signal to form an amplified output signal;
generating, by the switching stage, an error feedback signal, wherein the error feedback signal is configured to correct errors in the amplified output signal, and wherein the input signal is comprised of at least one of an analog signal and a digital signal; and
generating, by the switching amplifier system, a reset signal configured to reset the error feedback signal upon detection of a saturation event.

16. The method of claim 15, further comprising generating, by the switching amplifier system, a digital spread spectrum signal by modifying a pulse code modulation corresponding to a pulse width modulation algorithm.

17. The method of claim 15, further comprising generating, by combinatorial logic, a saturation detection signal, wherein the saturation detection signal is generated when the switching amplifier system undergoes a saturation event.

18. The method of claim 15, further comprising generating, by an oscillator and a ramp circuit, a pulse width modulation reference input signal based on a feedforward signal, wherein the oscillator generates a clock signal synchronized to a pulse width modulation reference input signal.

\* \* \* \* \*